United States Patent
Rohrbaugh et al.

(10) Patent No.: US 6,944,837 B2
(45) Date of Patent: Sep. 13, 2005

(54) SYSTEM AND METHOD FOR EVALUATING AN INTEGRATED CIRCUIT DESIGN

(75) Inventors: John G Rohrbaugh, Ft Collins, CO (US); Jeff Rearick, Ft Collins, CO (US); Christopher M Juenemann, Aurora, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 85 days.

(21) Appl. No.: 10/327,366

(22) Filed: Dec. 20, 2002

(65) Prior Publication Data

US 2004/0123206 A1 Jun. 24, 2004

(51) Int. Cl.$^7$ ............................................. G06F 17/50
(52) U.S. Cl. ................... 716/4; 716/5; 703/14; 703/15; 703/16; 324/210; 324/211; 714/724
(58) Field of Search ..................... 716/4–6; 703/14–16; 324/210–212; 714/724

(56) References Cited

U.S. PATENT DOCUMENTS

| | | | | |
|---|---|---|---|---|
| 6,197,605 B1 | * | 3/2001 | Simunic et al. | 438/14 |
| 6,199,031 B1 | * | 3/2001 | Challier et al. | 703/14 |
| 6,370,675 B1 | * | 4/2002 | Matsumura et al. | 716/6 |
| 6,421,634 B1 | * | 7/2002 | Dearth et al. | 703/14 |
| 6,549,881 B1 | * | 4/2003 | Dearth et al. | 703/21 |
| 2003/0237062 A1 | * | 12/2003 | Whitehill | 716/4 |

* cited by examiner

*Primary Examiner*—Vuthe Siek

(57) ABSTRACT

A system and method for evaluating a device under test (DUT) that utilizes a model of the DUT interfaced to DUT interface logic, which is designed to interface the DUT to automated testing equipment (ATE). By ensuring that the model includes a description of the DUT and of the DUT testing interface, conditions such as connections between ports of the IC (i.e., buddying) that may or may not be interfaced to the ATE may be included in the model to enable precise test pattern sets to be generated using the model. The test pattern sets may be used by a simulator to test the design of an IC or by ATE to test a fabricated IC having the design.

28 Claims, 6 Drawing Sheets

SYSTEM AND METHOD FOR EVALUATING AN INTEGRATED CIRCUIT DESIGN

TECHNICAL FIELD OF THE INVENTION

The present invention is generally related to a system and method for testing a device design. More particularly, the present invention is directed to a system and method for evaluating an integrated circuit design.

BACKGROUND OF THE INVENTION

Automated test equipment (ATE) is used to test integrated circuits (ICs) after they have been manufactured. In order to test a particular IC, the ATE is interfaced with the pins of the IC by interfacing logic, which typically comprises one or more printed circuit boards (PCBs). The integrated circuit being tested typically is referred to as the "device under test" (DUT) and the interfacing logic typically is referred to as the DUT interface. Because the DUT interface typically comprises one or more PCBs, the DUT interface is commonly referred to as the "DUT boards".

FIG. 1A illustrates a typical test system 75 for testing an integrated circuit 101. The system 75 includes a DUT interface 100 and ATE 105. The ATE 105 comprises a device tester 110. The DUT interface 100 generally is configured to connect each port of the IC 101 to respective input/outputs on the device tester 110 of the ATE 105.

In this example, IC 101, which corresponds to the DUT, includes input/output ports 120–127. The ports 120–127 of IC 105 are connected to device tester 110 via test interface 100. It can be seen that the test interface 100 comprises interconnects A–H, each of which is electrically connected to a respective port of the IC 101. These interconnects A–H are connected by respective conductors 150 to interface outputs A__–H__, respectively. Each interface output A__–H__ is directly connected to a respective input of the device tester 110.

During a test mode, the device tester 110 outputs stimulus data (i.e., one or more sets of test vectors) that is fed to the IC 101. The device tester 110 also receives response data from the IC 101 via the test interface 100. Based upon the response data received for given stimulus data, the operation/functionality of the IC 101 can be evaluated.

An IC design may also be evaluated before fabrication of an actual IC having the design by creating a software model of the IC and then processing the model. One manifestation of a software model of an IC is a structural netlist. For example, an IC may be represented by a Verilog or VHDL gate level netlist. As is well known to those skilled in the art, such an IC model may be provided as input to an automated test pattern generator (ATPG), which can generate a set of test patterns. Examples of ATPGs that are currently available are Synopsys TetraMax and Mentor Graphics Fastscan. The test patterns can be represented as stimulus and expected response data in languages such as Verilog or VHDL, for example. The test patterns and model can be processed by a simulator such as, for example, an NC-Verilog simulator or a VCS simulator, and the simulation results can be checked for correctness.

FIG. 1B shows a block diagram of a model 175 that is representative of an IC 101. The data structure representing the model 175 of the IC 101 is input to a simulator 176, which is a software program being executed on a computer (not shown) of suitable type. The simulator 176 also receives a test pattern set 178 that has been generated by an automatic test pattern generator (ATPG) 177. The test pattern set 178 includes test patterns and expected responses to the test patterns. The ATPG 177 also receives the IC model 175 and uses it to generate the test pattern set that is subsequently used by the simulator 176. The simulator 176 simulates operation of the IC 175 by running the model and tests of the model of the IC 175 with the test pattern set 178. The simulator 176 typically is used to test a design of an IC prior to the IC being fabricated to ensure the correctness of the design. The ATPG 177 utilizes the IC model 175 to generate the test pattern set 178. The ATPG 177 typically also is a software program being executed by a computer of some type.

The test pattern set 178 may be translated (not shown) and provided to the ATE 179, which is used to test an IC that has actually been fabricated. The ATE 179, when interfaced to a DUT via a DUT interface, such as that shown in FIG. 1A, tests and evaluates the DUT by outputting test patterns to the DUT and evaluating the results returned to the ATE.

During testing, the ATE utilizes test patterns that were generated by the ATPG in the aforementioned manner. The test patterns, also known as test vectors, comprise a series of logic 1s and 0s. In response to a given test pattern being input to the DUT, the DUT will produce a pattern of 1s and 0s that are output from the DUT to the ATE via the DUT interface. For each test pattern generated by the ATE, the ATE knows how the DUT should respond based on the model of the DUT. Therefore, for any given test pattern, the ATE can determine, based on the output received from the DUT via the DUT interface, whether a fault has occurred.

This known method of evaluating an IC design by modeling the IC generally works well as long as the IC being modeled has no more input/output ports than the device tester 110 (FIG. 1A) can be configured to accommodate. However, over the course of the past few years, the number of gates included in typical ICs has increased exponentially. Furthermore, as ICs have been fabricated to include more gates, the number of input/output ports necessary to interface the IC with external hardware/circuitry has also increased. Unfortunately, tester devices generally have not developed as quickly as IC designs. As a result, there are cases where tester devices are not equipped with enough inputs/outputs to provide for a direct connection with each and every input/output port of the IC. In such cases, it may not be possible to use such a tester device to directly evaluate the signal(s) on each and every input/output port of the IC.

Despite these changes in IC design complexity and limitations associated with some ATE configurations, the DUT interface is not taken into account in models used for IC testing. A need exists for a system for evaluating ICs that takes into account constraints that are placed on the inputs and outputs of the IC by the DUT interface logic.

SUMMARY OF THE INVENTION

The present invention provides a system and method for evaluating a device under test (DUT) that utilizes a model of the DUT interfaced to DUT interface logic, which is designed to interface the DUT to automated testing equipment (ATE). By ensuring that the model includes a description of the DUT and of the DUT testing interface, conditions such as connections between ports of the IC (i.e., buddying) that may or may not be interfaced to the ATE may be included in the model to enable precise test pattern sets to be generated using the model. The test pattern sets may be used by a simulator to test the design of an IC or by ATE to test a fabricated IC having the design.

The model is used by a test pattern generator (TPG) to generate test pattern sets, which include test patterns and expected responses to test patterns. These test pattern sets may be delivered along with the model to a simulator that will test the design represented by the model with the test patterns. Because the model represents the DUT interfaced to the DUT interface, appropriate test patterns can be generated by the TPG and these test patterns can be applied by the ATE to detect faults in a fabricated IC having the design represented by the model.

Other features and advantages of the present invention will become apparent to one with skill in the art upon examination of the following drawings and detailed description. It is intended that all such additional features and advantages be included herein within the scope of the present invention.

DETAILED DESCRIPTION OF THE PREFERRED EMBODIMENT

As stated above, there are cases where typical tester devices are not equipped with enough inputs/outputs to provide for a direct connection with each and every input/output port of an IC. Consequently, in the past, it was not believed to be possible to use a typical tester device to directly evaluate the signal(s) on each and every input/output port of the IC. In order to overcome this limitation of device testers, the assignee of the present application has developed technology that enables ICs to be tested by ATE by "buddying" certain predetermined input/output ports on the IC. In other words, certain predetermined ports are electrically tied together, or "shorted out" so that the same signal is present on the buddied ports. This buddying of ports is accomplished by configuring the DUT interface with appropriate traces to electrically connect predetermined ports. The buddied ports are not necessarily connected to the ATE, and therefore may not be tested by the ATE. Nevertheless, the assignee of the present application has determined other ways for testing the buddied ports.

In accordance with the present invention, it has been determined that when ports are buddied, a model that only models the IC and does not take this information and/or other information about the DUT interface into account may prevent the TPG from generating an appropriate test pattern set, and therefore prevent the ATE from applying appropriate stimuli for testing the IC (e.g., may cause signal contention). The present invention models the DUT as well as the DUT interface, and provides the TPG of the present invention with a model of the DUT and DUT interface so that the TPG can generate appropriate test patterns and responses that can be used by the ATE to precisely test the DUT.

The most common test pattern generator available is an automated test pattern generator (ATPG), but there are a variety of techniques that can be used to generate test patterns that are suitable for use by an ATE. Examples of a test pattern generator (TPG) that are suitable for use with the present invention for generating test patterns include, but are not limited to, 1) an ATPG, such as Synopsys TetraMax or Mentor FastScan, 2) a board level simulation where the test patterns for the IC are extracted by monitoring the ports of the IC, and 3) any software written to generate test patterns for a specific IC. However, as will be understood by those skilled in the art in view of the present disclosure, the present invention is not limited to any particular technique for generating test patterns. Test patterns could even be generated manually if desired.

Figure 2:
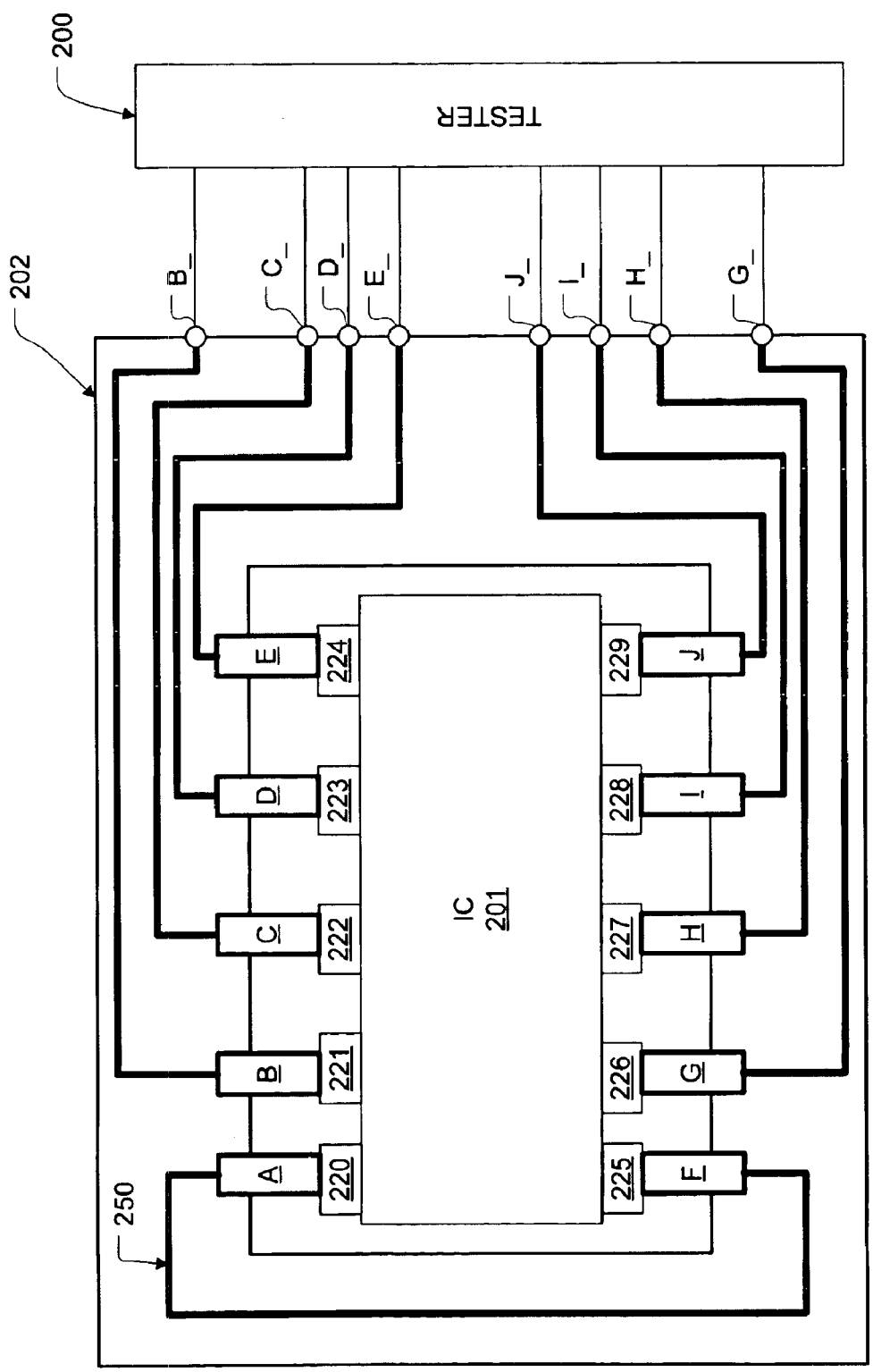
FIG. 2 is a diagram illustrating an IC connected to a tester device via a test interface, wherein the IC has more ports than the tester device can directly accommodate.

FIG. 2 illustrates a block diagram of an ATE tester 200, a DUT 201 and a DUT interface board 202 that interfaces the ATE 200 to the DUT 201. In accordance with the present invention, the ATE tester 200 utilizes a model that represents both the DUT 201 and the DUT interface board 202 in order to test and evaluate the DUT 201. It should be noted that the term "DUT" is intended to denote any type of IC. The term "DUT interface" is intended to denote any type of hardware, firmware, or combination thereof, configured to interface a DUT to a DUT tester.

For example purposes, the DUT 201 is shown as having more input/output ports (220–229) than the ATE tester device 200 can directly accommodate with direct electrical connection via the DUT interface board 202. In this example, certain ports are buddied together. More particularly, the DUT interface board 202 has been configured to provide electrical interconnects that tie the ports 220 and 225 together via an electrical connection 250 that runs between the two ports 220 and 225. It should also be noted that neither of the ports 220 and 225 is electrically connected to the ATE tester 200. The model of the DUT 201 and of the DUT interface 202 identifies ports 220 and 225 of the DUT 201 as being buddied and indicates that neither of the ports 220 and 225 are connected via the DUT interface 202 to the device tester 200.

FIG. 2 shows a limited number of ports 220–229 in order to aid discussions. It should be noted, however, that an IC may include up to and in excess of the ports of the tester. Despite the difference in the number of ports shown and discussed with respect to FIG. 2, the principles are the same and will be understood by those skilled in the art. An example of the model of the present invention in Verilog that takes both the DUT 201 and the DUT interface board 202 into account is as follows:

```
// Example of DUT interface Verilog model
module dut_interface(B_,C_,D_,E_,G_,H_);
inout B_,C_,D_,E_,G_,H_;
wire A_F;
```

-continued

```
chip
my_chip(.A(A_F),.B(B_),.C(C_),.D(D_),
.E(E_),.F(A_F),.G(G_),.H(H_));
endmodule
// Simple example of a chip included for
completeness
module chip(A,B,C,D,E,F,G,H);
inout A,B,C,D,E,F,G,H;
// Internal chip logic not shown
endmodule
```

Those skilled in the art are familiar with the Verilog modeling language and will understand this model. In this example, the letters A, B, C, D, E, F, G and H correspond to the ports of the DUT interface 202 that are connected, respectively, to pins 220, 221, 222, 223, 224, 225, 226, 227, 228 and 229 of the DUT 201. The code portion of the model between "module dut_interface" and the first "endmodule" corresponds to the model of the DUT interface board 202. The code portion of the model between "module chip (A,B,C,D,E,F,G,H);" and the next "endmodule" corresponds to the model of the DUT 201.

In the interface model portion of the code, the ports of the interface model are listed in the statement "module dut_ interface(B_,C_,D_,G_,H_);". Given that a DUT interface connects to the ATE, it is assumed that every port of the interface model connects to an ATE channel. In the IC model portion of the code, the ports of the IC are list in the statement "module chip(A,B,C,D,E,F,G,H);". In the interface model portion of the code, the instantiation of the IC (the "chip my_chip" statement) indicates which IC ports are and are not connected to one another and to the ATE. For example, the combination of ".A(A_F)" and ".F(A_F)" indicates that IC ports A and F are connected to each other. This further indicates that IC ports A and F are not connected to the ATE, given that "A_F" is not in the port list of the interface model.

Because the connections between the DUT interface ports and the IC and the connections between ports of the IC are described in the model, this enables a TPG to take the effect of the DUT interface board into account when generating patterns. It further enables a simulator to take the effect of the DUT interface board into account when simulating patterns. Of course, the actual modeling code for an IC and DUT interface board would be much more detailed than the code in this example, but those skilled in the art will understand the principles and concepts of the present invention and the manner in which they can be implemented from this simple example.

Figure 3:
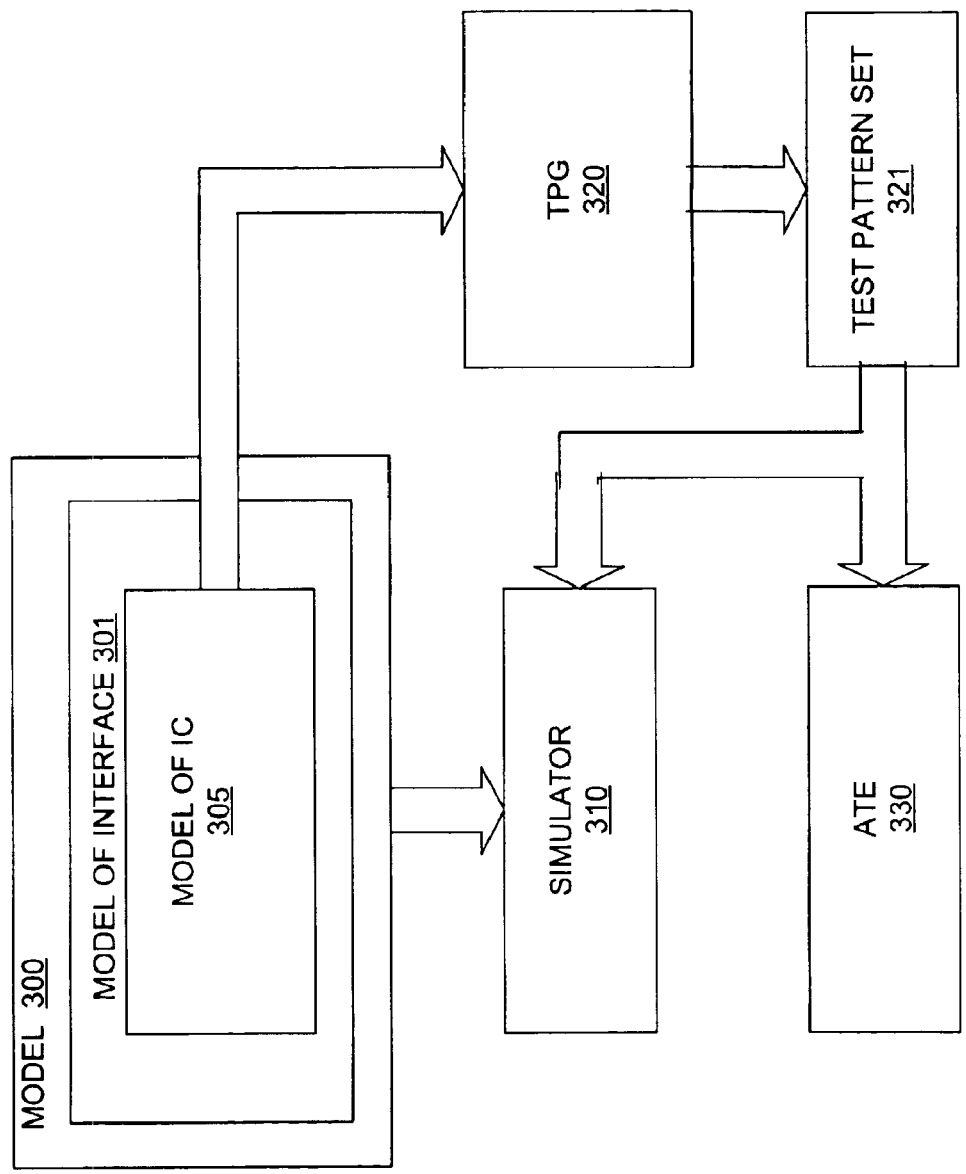
FIG. 3 is a diagram illustrating the system of the present invention in accordance with an example embodiment for evaluating an integrated circuit based upon a model representative of the integrated circuit and a test interface that interfaces the integrated circuit to a device tester.

FIG. 3 is a diagram illustrating the system of the present invention in accordance with an example embodiment. The operation of the system is as follows. The model 300 of the present invention, which comprises a combination of a DUT model 305 and a DUT interface model 301, is received by both a simulator 310 and by a TPG 320. The ATPG 320 processes the model 300 and produces a test pattern set 321 that can be used to test the IC that the model represents. The simulator 310 runs the model 300 and tests the model with the test pattern set 321 to detect faults in the IC design. The IC design can be modified in response to the test results obtained during simulation.

Figure 1A:
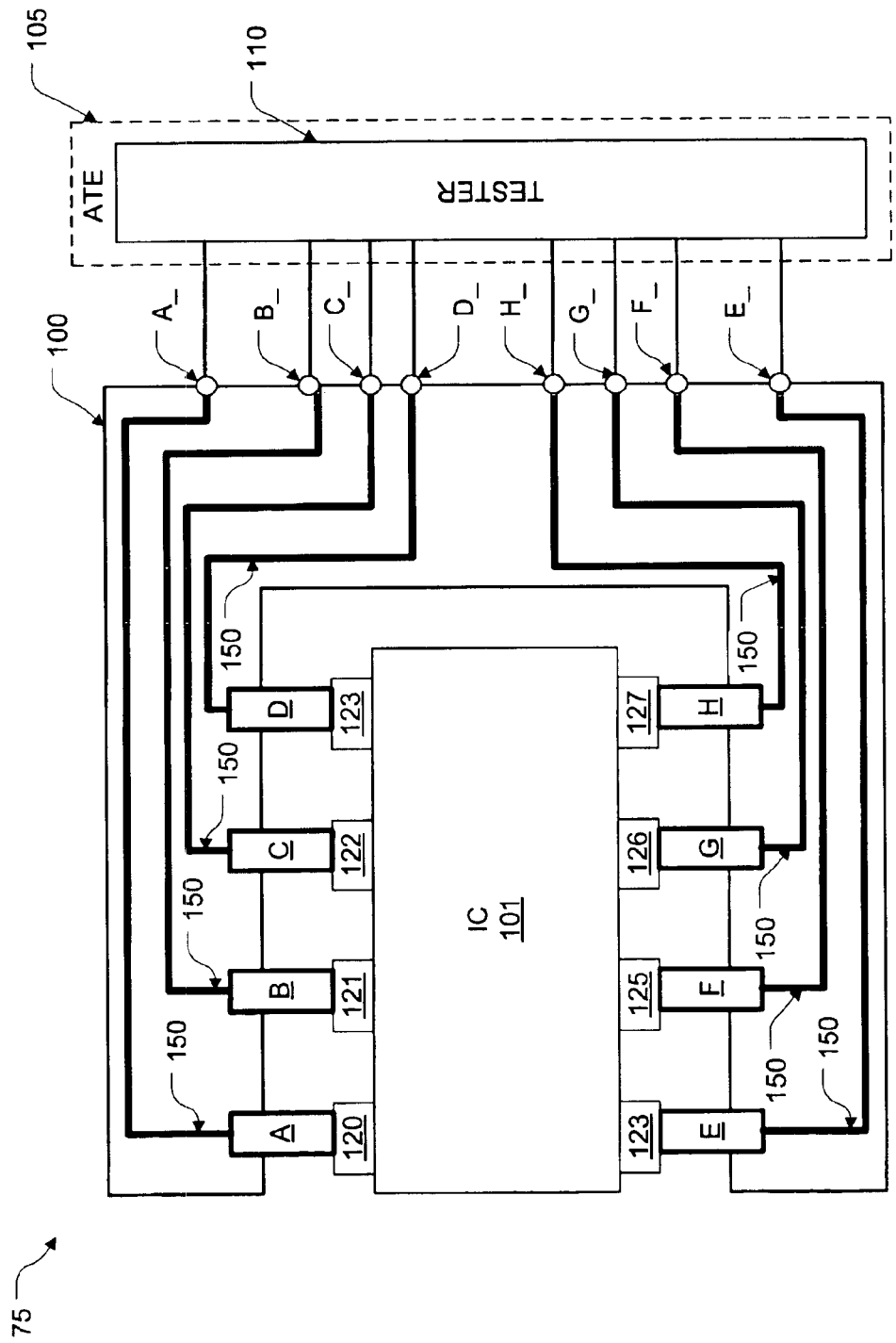
FIG. 1A is a diagram illustrating an integrated circuit connected to a device tester via a test interface.
Figure 1B:
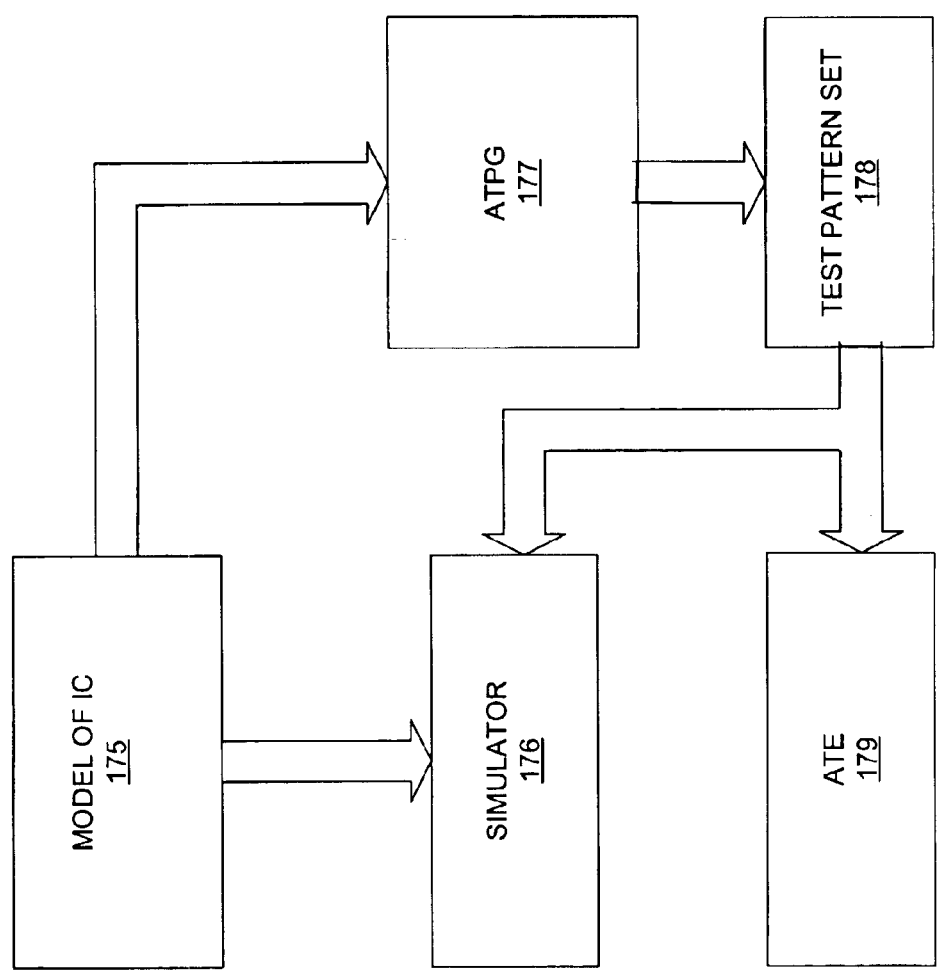
FIG. 1B is a diagram illustrating a system for evaluating an integrated circuit based on a model representative of the integrated circuit.

The test pattern set 321 may also be provided to an ATE device 330 for the purpose of testing a fabricated IC represented by the IC model 305. In this case, the ATE device 330 is interfaced to the actual IC as described above with reference to FIG. 2 (the ATE device 330 corresponds to tester 200 shown in FIG. 2). Because the test pattern set 321 is based on a model of the IC interfaced with the DUT interface, testing is more robust than in the case described above with reference to FIGS. 1A and 1B in which only the IC model is used by the TPG 177 to generate the test pattern set. This is particularly true when buddied ports exist, as described above with reference to FIG. 2. Components 310, 320 and 330 can be thought of as comprising computers executing software and memory for storing software and other data. The ATE 330 preferably also comprises hardware (not shown), such as an application specific integrated circuit (ASIC), that receives instructions from a processor (not shown) executing software to cause the hardware to produce the test patterns that are to be applied to the pins of the IC.

The model 300 preferably is in the form of a structural netlist that can be processed by, for example, an IC simulator 310, such as, for example, a Verilog-XL simulator, a VCS simulator, etc. The simulator 310 compiles the netlist and processes it in accordance with the test pattern set generated by the ATPG 320. The test pattern set 321 is utilized during testing by the ATE 330 to test the DUT 308, as described above with reference to FIG. 1A.

The definition of the term "model" as that term is used herein is intended to denote a hardware design expressed in a hardware description language (HDL), such as Verilog or VHDL, for example. For every piece of hardware in the design, the HDL contains a corresponding description (and vice-versa). A typical HDL might express the design at these levels as follows (or a combination thereof): (1) behavioral level; (2) register transfer language (RTL) level; (3) gate level; and (4) switch level. The design may be at a combination of any one or more of these levels. The behavioral level generally is relatively high level and essentially utilizes architectural and algorithmic elements to describe the design. RTL corresponds to a descriptive level that generally is behavioral, but adds detail such as registers (storage elements) and wires (signals). A gate level description corresponds to a structural netlist that uses basic circuit components (e.g., AND, OR, DFF, etc.) at the lowest levels of the design. The switch level corresponds to a netlist that uses transistors at the lowest levels of the design.

Figure 4:
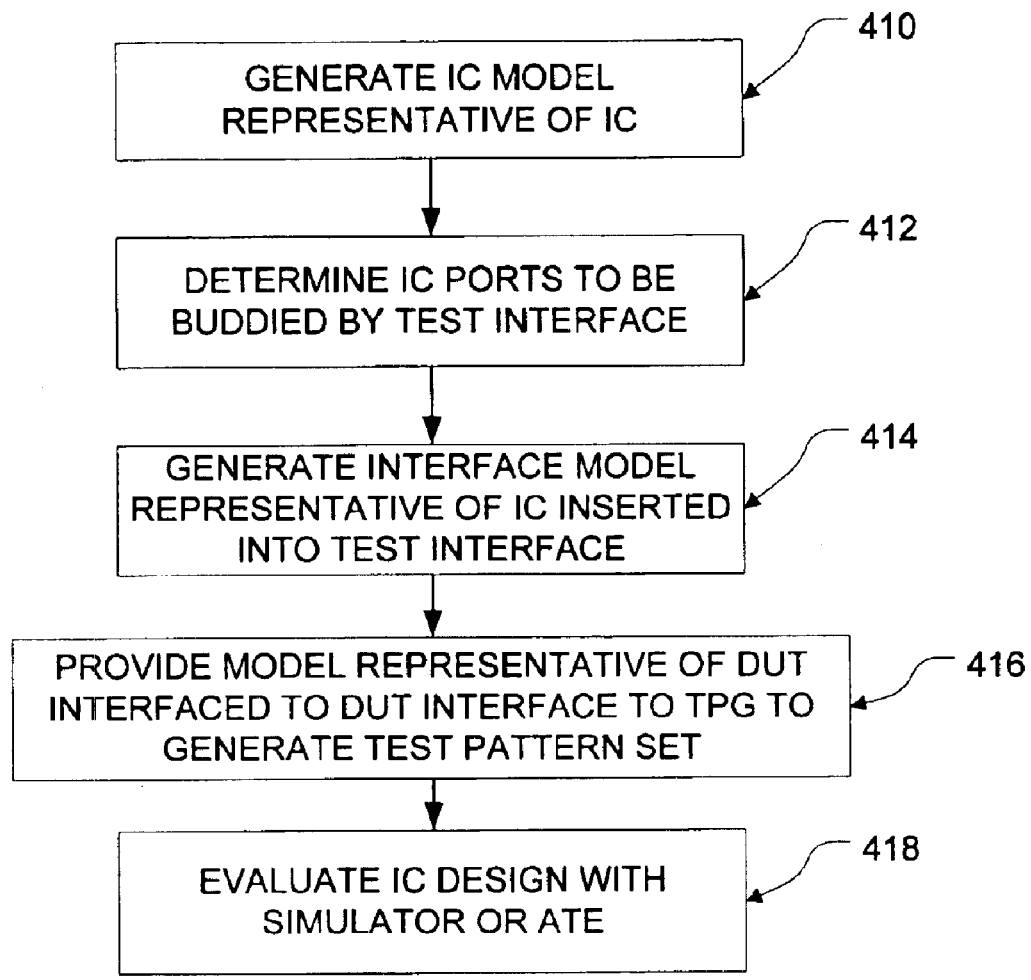
FIG. 4 is a flowchart illustrating the process of evaluating an integrated circuit in accordance with an example embodiment of the present invention.

An embodiment of the method of the present invention in accordance with an example embodiment for evaluating an integrated circuit design will now be described with reference to the flowchart of FIG. 4. A software model representative of the integrated circuit (IC model) is generated (410). In this example, a determination is made of which ports of an IC represented by the IC model would need to be "buddied" together in order to accommodate a limited number of input/output ports on an ATE tester device, such as tester 200 shown in FIG. 2 (412). A DUT interface model is generated (414). This DUT interface model will be representative of an actual implementation of an IC inserted into a DUT interface board, preferably one that is configured to enable port buddying. The DUT interface model corresponds to block 300 in FIG. 3. The DUT interface model may then be presented to a TPG, which generates a test pattern set (416) that may be used by a simulator to run a simulation of the DUT interface model or by ATE to test a fabricated IC (418). The order in which the steps are performed is not limited to any particular order and not all of the steps are required. For example, the step represented by block 412 may only be performed when ports are to be buddied. As will be understood by those skilled in the art in view of the present disclosure, utilizing the DUT interface model is advantageous even in situations in which no need to buddy ports exists.

Figure 5:
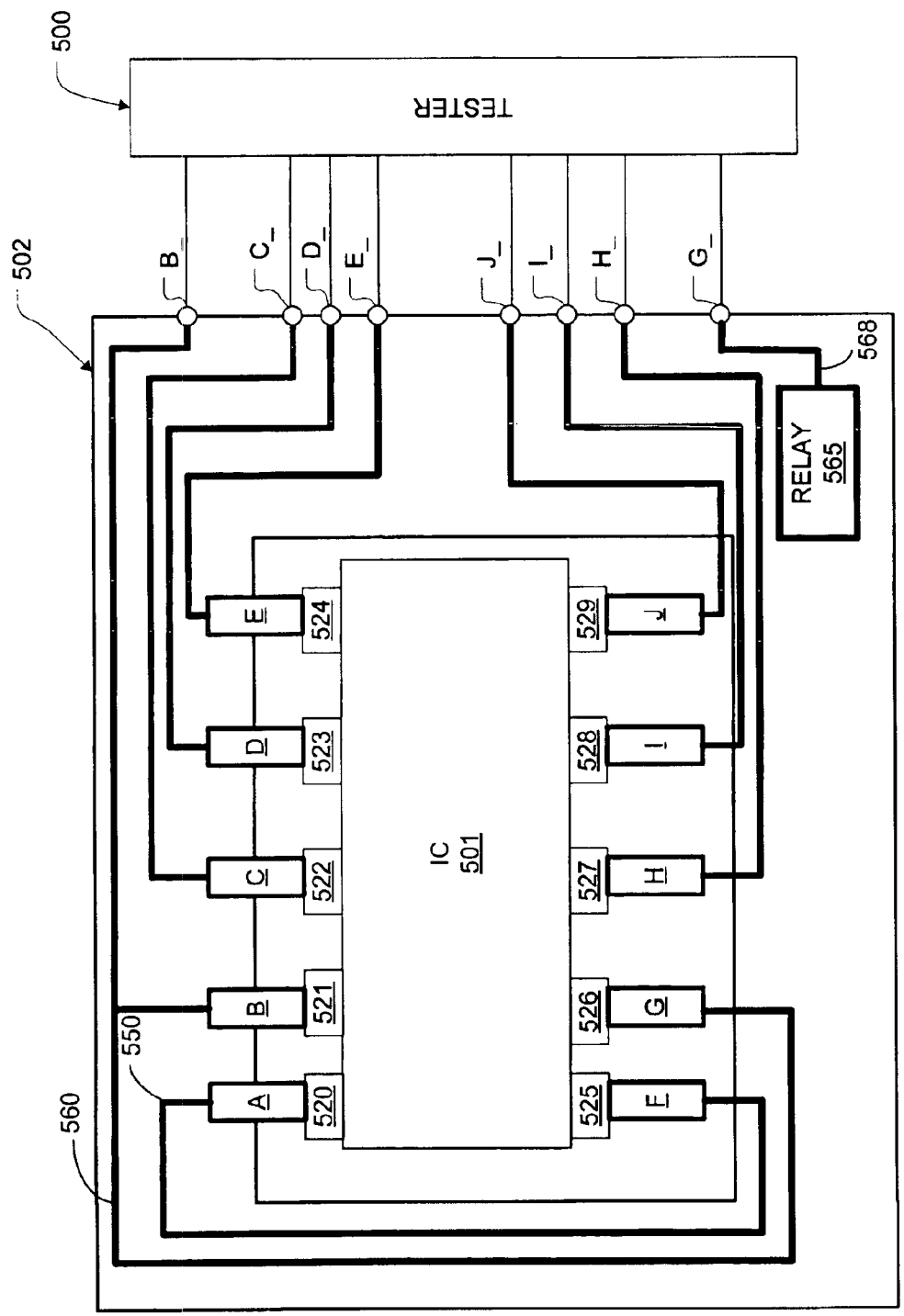
FIG. 5 is a diagram illustrating an IC connected to a tester device via a test interface, which demonstrates that some IC ports may be connected together and interfaced with the tester device, that some ports can be connected together and not interfaced to the tester device, and that some ports of the tester device may be connected to elements of the DUT interface that are not interfaced to any ports of the IC.

FIG. 5 is a diagram illustrating an IC connected to a tester device via a test interface, which demonstrates that some IC ports may be connected together and interfaced with the tester device, that some ports can be connected together and not interfaced to the tester device, and that some ports of the tester device may be connected to elements of the DUT interface that are not interfaced to any ports of the IC. The diagram shown in FIG. 5 shows three examples of information about the DUT and the DUT interface that are taken into account in accordance with the present invention by modeling the DUT interfaced with the DUT interface. In the diagram shown in FIG. 5, ports 520 and 525 of the IC 501 are connected together by interconnection 550, but neither of these ports is connected by the DUT interface 502 to the tester 500. In contrast, ports 521 and 526 of IC 501 are connected together by interconnection 560, which is connected to port B__ of the tester 500. Port G__ of the tester 500 is connected by interconnection 568 to a relay device 565 of the DUT interface 502, but is not interconnected to a port of the IC 501. The relay device 565 may be used to provide switching of an element (not shown) in the interface 502. It is merely shown to provide an example of an interconnection between the tester 500 and the interface 502 without an interconnection to the IC 501. These are three example scenarios that would be taken into account by the model of the IC interfaced to the DUT interface in order to enable the TPG to generate a precise test pattern set. Thus, in the flow chart of FIG. 4, step 412 may include a determination of these conditions.

Another advantage of modeling the IC interfaced to the testing interface logic is that it enables port names of the IC to be different from the port names of the tester, and thus does not require a mapping of the IC port names to the names of the ports of the tester to which the IC ports are connected. In some cases, the number of bits that can be used to identify a tester port is limited to a number of bits that is less than the number of bits that are used in the model code to identify a port of the IC. In these cases, before the IC can be tested, the port names of the IC must be mapped to the respective port names of the tester. Because the model of the present invention is a model of the IC interfaced to the testing interface logic, the model inherently identifies the connection of ports of the IC to ports of the tester, which obviates the need to perform a name mapping process prior to testing. The term "name" as that term is used herein is intended to denote any identifier used in the code model to identify a port of an IC and/or a port of the ATE tester.

Below, a Verilog model representing the IC 501 interfaced to the DUT interface logic 502 in the manner shown in FIG. 5.

```
// Example of DUT interface Verilog model
module dut_interface(B__,C__,D__,E__,G__,H__);
   inout B__,C__,D__,E__,G__,H__;
   wire A_F;
   chip
   my_chip(.A(A_F),.B(B__),.C(C__),.D(D__),
   .E(E__),.F(A_F),.G(B__),.H(H__));
   test_cntl my_cntl(.IN(G__));
endmodule
// Simple example of a chip included for
completeness
module chip(A,B,C,D,E,F,G,H);
   inout A,B,C,D,E,F,G,H;
   // Internal chip logic not shown
endmodule
// A ports only definition of test control
circuitry included for
completeness
module test_cntl (IN);
   input IN;
   // Internal test control function not shown
endmodule
```

As in the previous example described above with reference to FIG. 2, the internal logic of then IC 501 is not described by the model for purposes of simplicity. Those skilled in the art will understand the manner in which the example above could be modified to include a description of the internal logic of IC 501. The combination of ".B(B__)" and ".G(B__)" indicates that these ports are connected to each other. Furthermore, it indicates that these ports are also connected to the ATE, given that "B__" is in the port list of the interface model.

It should be noted that the above-described embodiments of the present invention are example embodiments of the present invention and that the present invention is not limited to these embodiments. Many variations and modifications can be made to the above-described embodiments without departing from the scope of the invention. All such modifications and variations are within the scope of the present invention.

What is claimed is:

1. An apparatus for evaluating an integrated circuit (IC), the apparatus comprising:
    a simulator, the simulator being configured to receive and process a data structure corresponding to a model of an IC and of testing interface logic configured to electrically connect input/output (I/O) ports of the IC to a tester device that is external to the IC, wherein when the simulator processes the data structure, operations of the IC interfaced to testing interface logic are simulated.

2. The apparatus of claim 1, wherein when the operations of the IC interfaced to the testing interface logic are simulated, the simulator simulates testing of the IC interfaced to the testing interface logic with a set of test patterns.

3. The apparatus of claim 1, wherein the model includes a description of ports of the IC that are electrically connected together by the testing interface logic.

4. The apparatus of claim 1, wherein the model is a netlist.

5. An apparatus for evaluating an integrated circuit (IC), the apparatus comprising:
    a test pattern generator (TPG), the TPG being configured to receive and process a data structure corresponding to a model of an IC and of testing interface logic configured to electrically connect input/output (I/O) ports of the IC to a tester device that is external to the IC, wherein the TPG processes the data structure to generate a set of test patterns, the test pattern set including test patterns for testing the IC interfaced to the testing interface logic and expected results of testing the IC interfaced to the testing interface logic.

6. The apparatus of claim 5, wherein the model includes a description of ports of the IC that are electrically connected together by the testing interface logic.

7. The apparatus of claim 5, wherein the model is a netlist.

8. A method of evaluating an integrated circuit (IC), the method comprising the steps of:
    receiving a data structure representative of a model of an IC; and
    generating an interface model representative of the IC interfaced with testing interface logic configured to electrically connect input/output (I/O) ports of the IC to a tester device that is external to the IC; and combining the IC model and the interface model to produce a model of the IC interfaced to the testing interface logic.

9. The method of claim 8, further comprising the step of:

processing the model of the IC interfaced to the testing interface logic in a simulator to simulate operations of the IC interfaced to the testing interface logic.

10. The method of claim 9, wherein the operations of the IC are simulated by simulating processing by the IC of test patterns.

11. The method of claim 8, wherein the model of the IC interfaced to the testing interface logic is a netlist.

12. The method of claim 8, wherein the model of the IC interfaced to the testing interface logic includes a description of ports of the IC that are electrically connected together by an electrical interconnection.

13. The method of claim 12, wherein the ports of the IC include at least first and second ports that are connected together by an electrical interconnection, and wherein the electrical connection that interconnects the first and second ports together is interfaced to a port of a tester via the testing interface logic.

14. The method of claim 12, wherein the ports of the IC include at least first and second ports that are connected together by an electrical interconnection, and wherein the electrical connection that interconnects the first and second ports together is not interfaced to any port of a tester via the testing interface logic.

15. The method of claim 12, wherein the model includes a description of at least one port of a tester that is interfaced to an element of the testing interface logic that is not interfaced to a port of the IC.

16. The method of claim 12, wherein the model includes a description of a particular port of a tester that is interfaced to a particular port of the IC, and wherein the particular port of the tester has a name that is different from the particular port of IC in the model.

17. The method of claim 8, further comprising the step of:

processing the model of the IC interfaced to the testing interface logic in a test pattern generator (TPG) to generate a set of test patterns, the test pattern set including test patterns for testing the IC and expected results of testing the IC with the test patterns.

18. The method of claim 17, wherein the model of the IC interfaced to the testing interface logic is a netlist.

19. The method of claim 17, wherein the model of the IC interfaced to the testing interface logic includes a description of ports of the IC that are electrically connected together by the testing interface logic.

20. The method of claim 17, further comprising the step of:

delivering the set of test patterns to automated testing equipment (ATE);

interfacing the IC to the ATE via the testing interface logic:

outputting one or more test patterns of the set of test patterns from the ATE to at least one pin of the IC; and receiving test results at the ATE output from at least one pin of the IC and comparing the test results with expected test results to determine whether a fault in the IC has been detected.

21. A computer program for evaluating an integrated circuit (IC), the program being embodied on a computer-readable medium, the program comprising:

a first code segment for generating an interface model representative of the IC interfaced with testing interface logic configured to electrically connect input/output (I/O) ports of the IC to a tester device that is external to the IC; and a second code segment for combining the IC model and the interface model to produce a model of the IC interfaced to the testing interface logic.

22. The program of claim 21, further comprising:

a third code segment for processing the model of the IC interfaced to the testing interface logic in a simulator to simulate operations of the IC interfaced to the testing interface logic.

23. The program of claim 22, wherein the third code segment simulates the operations of the IC by simulating processing by the IC of test patterns.

24. The program of claim 21, wherein the model of the IC interfaced to the testing interface logic is a netlist.

25. The program of claim 21, wherein the model of the IC interfaced to the testing interface logic includes a description of ports of the IC that are electrically connected together by the testing interface logic.

26. A computer program for evaluating an integrated circuit (IC), the program being embodied on a computer-readable medium, the program comprising:

a first code segment for generating art interface model representative of the IC interfaced with testing interface logic configured to electrically connect input/output (I/O) ports of the IC to a tester device that is external to the IC;

a second code segment for combining the IC model and the interface model to produce a model of the IC interfaced to the testing interface logic; and a third code segment for processing the model of the IC interfaced to the testing interface logic in a test pattern generator (TPG) to generate a set of test patterns, the test pattern set including test patterns for testing the IC and expected results of testing the IC with the test patterns.

27. The program of claim 26, wherein the model of the IC interfaced to the testing interface logic is a netlist.

28. The program of claim 26, wherein the model of the IC interfaced to the testing interface logic includes a description of parts of the IC that are electrically connected together by the testing interface logic.

* * * * *